(12) United States Patent
Haworth et al.

(10) Patent No.: US 11,119,535 B2
(45) Date of Patent: Sep. 14, 2021

(54) OPENING FORCE CONTROL FOR FOLDABLE ELECTRONIC DEVICES

(71) Applicant: Microsoft Technology Licensing, LLC, Redmond, WA (US)

(72) Inventors: Madeleine M. Haworth, Seattle, WA (US); Joseph B. Gault, Seattle, WA (US); Brittany Barbara, Seattle, WA (US); John C. Meyer, Redmond, WA (US); Matthew T. Condon, Seattle, WA (US); Anthony G. Picardo, Tacoma, WA (US); Aseem Singla, Bothell, WA (US); Shuanghu Zhang, Suzhou (CN); Melvin R. Greiser, II, Sammamish, WA (US); Leila Asfari, Seattle, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/557,926

(22) Filed: Aug. 30, 2019

(65) Prior Publication Data
US 2021/0064085 A1    Mar. 4, 2021

(51) Int. Cl.
*H05K 5/00* (2006.01)
*G06F 1/16* (2006.01)
(Continued)

(52) U.S. Cl.
CPC .......... *G06F 1/1618* (2013.01); *G06F 1/1656* (2013.01); *G06F 1/1681* (2013.01); *H05K 5/0226* (2013.01); *H05K 5/03* (2013.01)

(58) Field of Classification Search
None
See application file for complete search history.

(56) References Cited

U.S. PATENT DOCUMENTS 7,082,035 B2    7/2006  Kim
8,143,982 B1 *  3/2012  Lauder ............... G06F 1/1626
                                                       206/320
(Continued)

FOREIGN PATENT DOCUMENTS

AU          2015219236 A1    8/2016

OTHER PUBLICATIONS

Girbea, Andrei, "Acer Spin 7 SP714-51 Review—Ultra-Slim Convertible with Fanless Hardware", Retrieved from https://www.ultrabookreview.com/14114-acer-spin-7-review/, Sep. 3, 2018, 10 Pages.

(Continued)

*Primary Examiner* — Anthony Q Edwards
*Assistant Examiner* — Rashen E Morrison (57) ABSTRACT

A foldable electronic device includes a first portion, a second portion, and a hinge connecting the first portion and the second portion. The hinge is configured to allow pivoting movement of the first portion relative to the second portion, wherein the hinge has a hinge force. One or more magnets are coupled to the first portion, and a plurality of metal members are coupled to the second portion. Each metal member of the plurality of metal members is configured for individual removal from the second portion to define a magnetic force based on the hinge force, thereby allowing the first and second portions to be maintained together when in a closed orientation and allowing for easy one finger opening operation from the closed orientation.

20 Claims, 9 Drawing Sheets

SPINE TEST

TABLE TEST (51) Int. Cl.
    *H05K 5/02*    (2006.01)
    *H05K 5/03*    (2006.01)

(56) References Cited

U.S. PATENT DOCUMENTS

| | | |
|---|---|---|
| 8,705,229 B2 | 4/2014 | Ashcraft et al. |
| 9,161,469 B2 * | 10/2015 | Han .................... G06F 1/1618 |
| 9,753,498 B1 * | 9/2017 | Liang .................. G06F 1/1677 |
| 9,995,070 B2 * | 6/2018 | Hamel ................. G06F 1/1677 |
| 10,162,381 B2 | 12/2018 | Hsu et al. |
| 2005/0023841 A1 | 2/2005 | Chen |
| 2005/0239261 A1 * | 10/2005 | Tai ........................ H05K 3/365 |
| | | 438/380 |
| 2007/0067954 A1 * | 3/2007 | Finney ................ H04M 1/0247 |
| | | 16/235 |
| 2010/0283270 A1 | 11/2010 | Hood et al. |
| 2013/0083466 A1 * | 4/2013 | Becze ................ G06F 3/04886 |
| | | 361/679.27 |
| 2013/0250497 A1 | 9/2013 | Wu |
| 2013/0286551 A1 | 10/2013 | Ashcraft et al. |
| 2015/0237748 A1 * | 8/2015 | Andre .................. E05B 17/0033 |
| | | 361/679.55 |
| 2015/0378399 A1 * | 12/2015 | Grinstead ............. G06F 1/1632 |
| | | 361/679.09 |
| 2017/0083049 A1 * | 3/2017 | Kim ..................... G06F 1/1626 |
| 2018/0107253 A1 * | 4/2018 | Landwehr ............ G06F 1/1616 |

OTHER PUBLICATIONS

"International Search Report and Written Opinion Issued in PCT Application No. PCT/US20/038579", dated Nov. 4, 2020, 11 Pages.

\* cited by examiner

OPENING FORCE CONTROL FOR FOLDABLE ELECTRONIC DEVICES

BACKGROUND

Portable electronic devices, such as foldable laptops having hinged portions (keyboard and display) can be opened relative to each other at different angles, such as based on a desired viewing angle. In some of these devices, a magnetic closure arrangement maintains the two portions in abutting engagement when in a closed position (e.g., when transported in a backpack). Moreover, the magnetic strength is selected to maintain the device in a closed position, such as when the device is placed on a spine thereof, but also allows a user to apply a force to cause the two portions to separate.

However, in these devices having a magnetic closure arrangement, because of allowable tolerances in the manufacturing thereof, including the hinge and magnets, the magnetic force applied can vary between different devices of the same type (e.g., individual laptop computers of the same model). That is, the magnetic closure arrangement is configured to apply a magnetic force to exceed manufacturing tolerances, which can vary between individual devices. For example, in conventional magnetic closure arrangements, there is no way to control the opening force of individual devices, which makes the opening force subject to tolerance variations of sub-components. As a result, the magnetic closure arrangement is designed with an overcompensating magnet force to accommodate system tolerances, which creates a sub-optimal experience for many devices (e.g., device is too difficult to open with single finger operation). In some arrangements, binning magnets are used to address this issue, which adds cost to the overall system. In other arrangements, high-torque and low-torque hinges are paired to address this issue, which also adds cost to the overall system.

Thus, typical ways of setting the opening force for the magnetic closure arrangement varies and is not controllable. As a result, the user experience can be reduced as a result of having the device unexpectedly open or making it more difficult to open.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A method for adjusting an opening force of a foldable electronic device comprises coupling one or more base metal members to a cover, installing the cover to the foldable electronic device with a pivoting connection, and measuring an opening force of the cover. The method further comprises identifying an adjustment configuration to place the opening force within a defined specification and removing the cover and applying the adjustment configuration by removing or adding one or more metal members to the cover. The method also includes reinstalling the cover to the foldable electronic device.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Corresponding reference characters indicate corresponding parts throughout the drawings. In the figures, the systems are illustrated as schematic drawings. The drawings may not be to scale.

DETAILED DESCRIPTION

Arrangements described herein are configured to individually control the magnetic opening force of foldable electronic devices (e.g., laptop computers). Selectable metal members (tabs) and configurations thereof allow for adjustability of magnet force to balance hinge torque and eliminate the need for binning. Metal members of various examples are selectable to change the magnetic force for a particular device to adjust for the hinge torque of the device. For example, the magnetic interaction area can be selectively increased or decreased to change a corresponding magnetic force. The selective magnetic interaction area allows for compensation of variables that affect desired opening operation, such as one finger opening and maintained closure when positioned on a spine (e.g., weight, center of gravity, hinge force, etc. of the individual device). An improved user experience thereby results wherein the device stays closed when supported on a spine and can be separated by a single finger when placed on a surface without also lifting the base.

It should be noted that although the various examples are described in connection with a foldable laptop computing device (e.g., Microsoft Surface® laptop), the present disclosure can be implemented in connection with other electronic devices having two portions that move or fold relative to each other (e.g., keyboard and display having a hinged connection). For example, the magnetic control and adjustment aspects can be used to control the magnetic force for any magnetic closure arrangement in electronic and non-electronic devices, such as computing devices employing one or more hinges that can rotationally move first and second device portions, as well as provide resistance to maintain particular orientations of the first and second portions.

Figure 1:
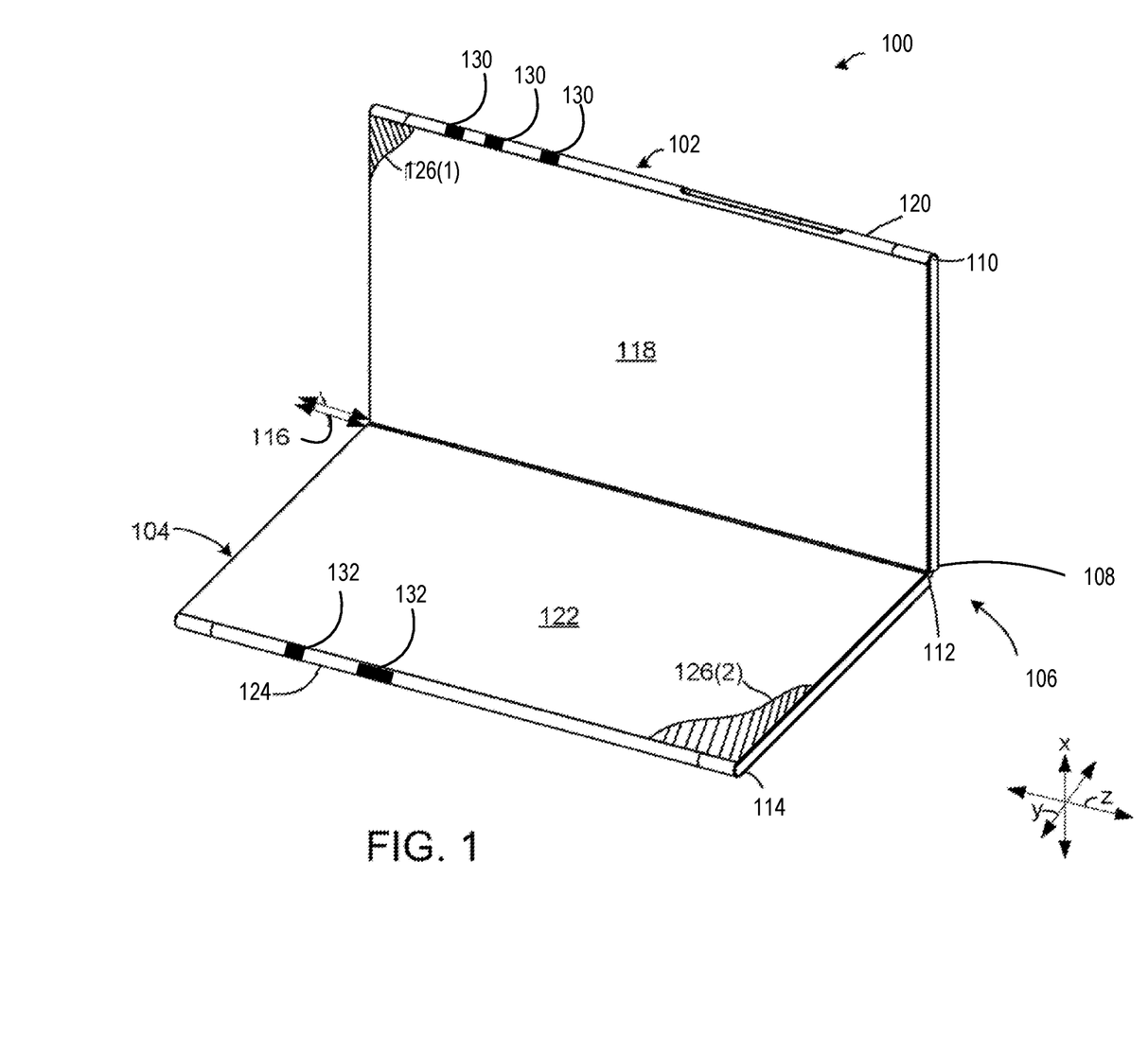
FIG. 1 illustrates a foldable electronic device according to an embodiment.

More particularly, a device 100 having selective and controllable magnetic opening force is shown in FIG. 1. The device 100 is illustrated as a foldable electronic device having first and second portions 102 and 104 that are rotatably movable to different positions (e.g., a closed position and different angled open positions) by a hinge 106, which can be any suitable hinge mechanism that allows for rotational movement of the first portion 102 (e.g., display) relative to the second portion 104 (e.g., display screen).

In the illustrated example, the first portion 102 extends from a hinge end 108 to a distal end 110. The second portion 104 extends from a hinge end 112 to a distal end 114. The hinge 106 defines a hinge axes 116 about which the first and second portions 102 and 104 rotate between a closed position and different angled open positions. The first portion 102 includes opposing first and second major surfaces 118 and 120. For example, the first major surface 118 being a front display surface and the second major surface 120 being a top of a protective outside case. Similarly, the second portion 104 includes opposing first and second major surfaces 122 and 124. For example, the first major surface 122 being a keyboard and the second major surface 124 being a bottom of the protective outside case. It should be noted that the second surfaces 120 and 124 are facing away from the viewer and as such are not directly visible in this view. In some implementations, displays can be positioned on one or both of the first surfaces 118 and 122.

In operation, the magnetic closure arrangement, which in the illustrated example comprises a plurality of magnets 130 coupled to the first portion 102 and a plurality of metal members 132 coupled to the second portion 104, maintains the first and second portions 102 and 104 in a closed orientation (e.g., in abutting engagement where the first and second portions 102 and 104 are positioned against one another and are secured by magnetic force) as a result of the magnetic force selectively controlled by the present disclosure, but that also allows one finger opening operation. In the closed orientation, the second surfaces 120 and 124 are facing outwardly with the first surfaces 118 and 122 facing inwardly. The selective magnetic force configured according to the present disclosure maintains the closed orientation by magnetic attraction until acted upon by the user. The opening force to separate the first and second portions 102 and 104 is selectively controllable using different configurations of the metal members 132 coupled therein and at edges thereof, as described in more detail herein.

Figure 2:
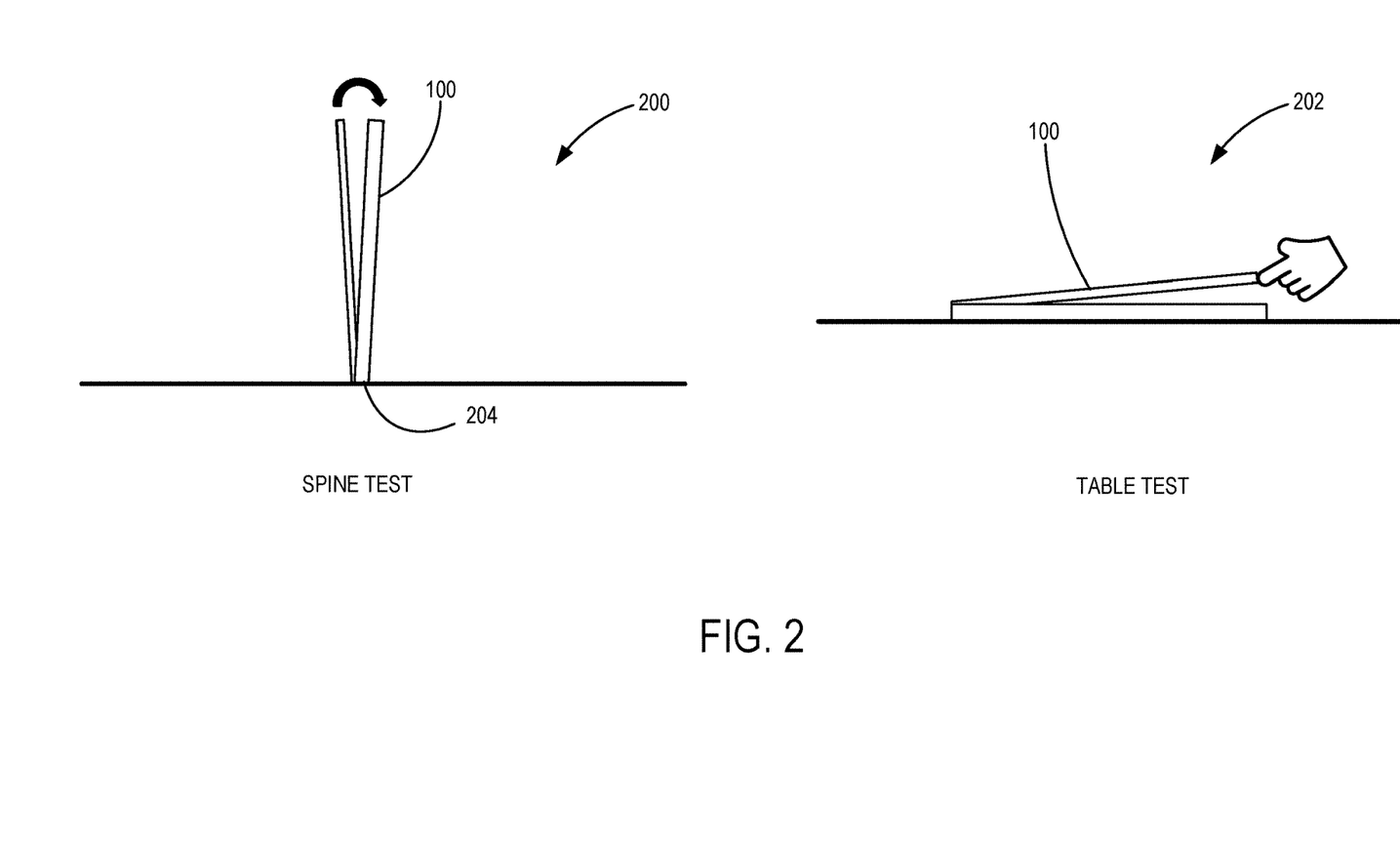
FIG. 2 illustrates force tests according to an embodiment.

When closed, the user can then start to open the device 100 (e.g., rotate the device portions 102 and 104 away from one another) using a one finger operation as a result of the tuned magnetic force described herein. That is, the magnetic force tuned by various examples maintains the device 100 in a closed orientation when the first and second portions 102 and 104 are abutting one another, but also allows for one finger operation to apply a force that overcomes the magnetic attraction of the first and second portions 102 and 104 to move the device into an open orientation as shown in FIG. 1. For example, implementing the present disclosure, the device 100 satisfies both a spine test 200 and a table test 202 as illustrated in FIG. 2. That is, the present disclosure configures a foldable electronic device that satisfies both a spine test force requirement and a table test force requirement.

More particularly, in the spine test 200, the device 100 stays closed when only supported in a spine 204 of the device 100. In the table test 202, the device 100 can be opened, for example, by the user lifting the display of the laptop device (the first portion 102) with a single finger without also lifting the base (the second portion 104). As an example, satisfying the spine test 200 means that the device 100 will not "pop" open in a backpack, which can turn on the display screen of the device 100 and drain the battery. Moreover, satisfying the table test 202 means that a user is able to employ a one finger operation to lift the cover (and only the cover) with only one finger.

Thus, the device 100 is maintained in a closed position and the user is able to open the device 100 to a desired angle between the first and second portions 102 and 104 using a single finger (e.g., about 110 degrees). It should be noted that the magnetic force is tuned corresponding to the hinge force of the hinge 106 for the particular device and allows the hinge 106 to hold the first and second portion 102 and 104 in an angled orientation (e.g., the device 100 maintains orientation unless acted upon by the user). This orientation is referred to as a 'notebook' or 'laptop' orientation. For example, the notebook orientation can be manifest as an angle in a range from about 90 degrees to about 150 degrees. In this orientation, the device portions 102 and 104 are configured to maintain this relative orientation while the user uses the device. For example, video content can be presented on a graphical user interface (GUI) of the first portion 102.

Accordingly, the present disclosure allows individualized magnetic force control to balance the hinge torque of the device 100 with the magnet force, which can both vary due to manufacturing tolerances. That is, both the spine test 200 and the table test 202 are satisfied according to the present disclosure. In conventional approaches, the tolerances of the hinge force and the magnet force are balanced to maintain these forces within specification limits. As a result, while the magnet force is sufficient to satisfy the spine test, in order to satisfy the specification limits, overcompensation of the magnet force is used to accommodate for system tolerances, thereby causing the device 100 to fail the table test (i.e., magnet force too great to allow one finger operation and/or causes the base to lift when the display is lifted). That is, the magnet force is selected in conventional approaches to always be greater than a hinge force to pass the spine test 200, but which results in the device 100 not always passing the table test 202.

In contrast, the present disclosure allows for adjustment of the magnetic force to create a consistent, optimal user experience for opening the device 100 regardless of tolerances. That is, in various examples, the magnetic interaction area is changed to adjust the magnetic force for the individual device 100. The magnetic interaction area is selectively increased or decreased in some examples to change a corresponding magnetic force to ensure that the spine test 200 and the table test 202 are both satisfied, while also providing one finger opening operation of the device 100. It should be appreciated that the present disclosure can be implemented with the device 100 having different covers or top surfaces. For example, the top surface of the keyboard (e.g., first surface 122) is a fabric surface in some implementations, and a metal surface in other implementations. With the present disclosure, the magnetic force is selectively adjustable for the device 100 regardless of the surface type or cover.

Figure 3:
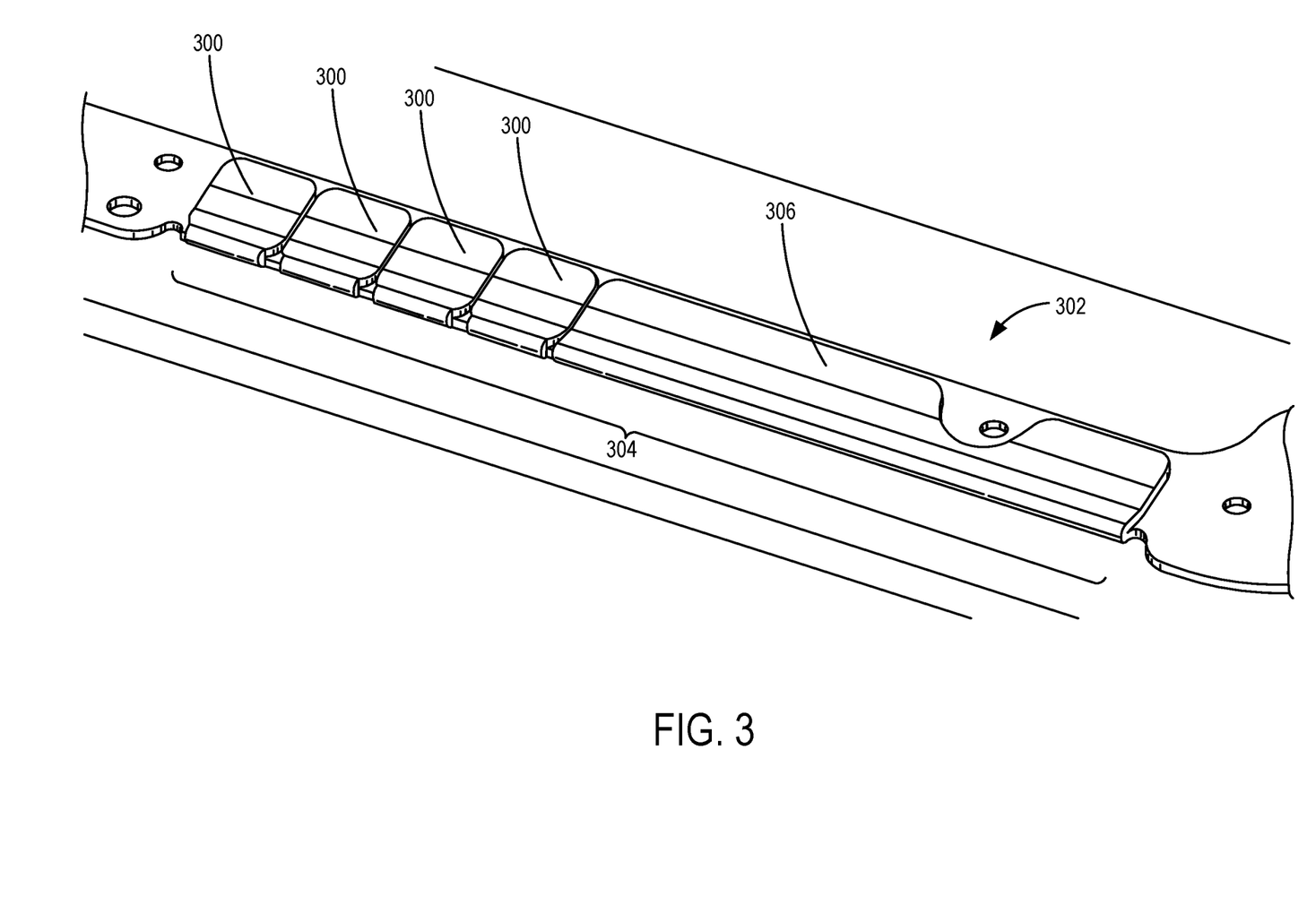
FIG. 3 illustrates an arrangement of metal members according to an embodiment.

More particularly, various examples allow for adjustable magnetic force using a plurality of metal members 300, which are illustrated in FIG. 3 as metal tabs (e.g., rectangular steel tabs) that can be selectively added or removed from an edge 302 of the device 100. That is, one or more of the metal members 300 are added or removed to define a magnetic interaction area 304 that affects the magnetic attraction of one portion (e.g., keyboard portion) of the device 100 with another portion for the device 100 (e.g., display portion), such as the portions 102 and 104 (illustrated in FIG. 1). It should be noted that while the metal members 300 are all shown having a same size, the size, including the length, width, and thickness, of any of the metal members 300 can be varied as desired or needed. For example, different sized and/or shaped metal members 300 are provided in some examples to define different levels of adjustable magnetic attraction granularity, which can be based in part on the force of the hinge(s) 106 of the device 100.

Additionally, in some examples, and as illustrated in the implementation of FIG. 3, a metal member 306 is configured as a base magnetic attraction member that is larger than the metal members 300. The metal member 306 is sized to define a starting point (size) for the magnetic interaction area 304, which is below a defined threshold for the spine test 200. However, as described in more detail herein, is some examples, predefined configurations for the magnetic interaction area 304 are used that include a defined number of metal pieces, which can be the metal members 300, the metal member 306, or other metal pieces.

In one example, each of the metal members 300 is formed from steel and is 4 millimeters (mm) in length, 3.1 mm in width and have a thickness of 0.4 mm; and the metal member 306 are formed from steel and are each 19 mm in length, 3.1 mm in width, and 0.4 mm in thickness. The dimensions are merely for illustration and can be changed as desired or needed. Also, the material from which the metal members 300 and metal member 306 are formed can be changed, such as being formed from steel, iron, nickel, and/or cobalt, which further allows for selective control of the amount of magnetic attraction. As other nonlimiting examples, the metal members 300 and metal member 306 can be formed from different types of metals, such as ferromagnetic, paramagnetic and diamagnetic metals. Thus, the size, shape, configuration, and/or materials of the metal members 300 and metal member 306 can be varied to selectively change the magnetic attraction of the magnetic interaction area 304, thereby affecting the corresponding magnetic force needed to separate the portions of the device 100.

Figure 4:
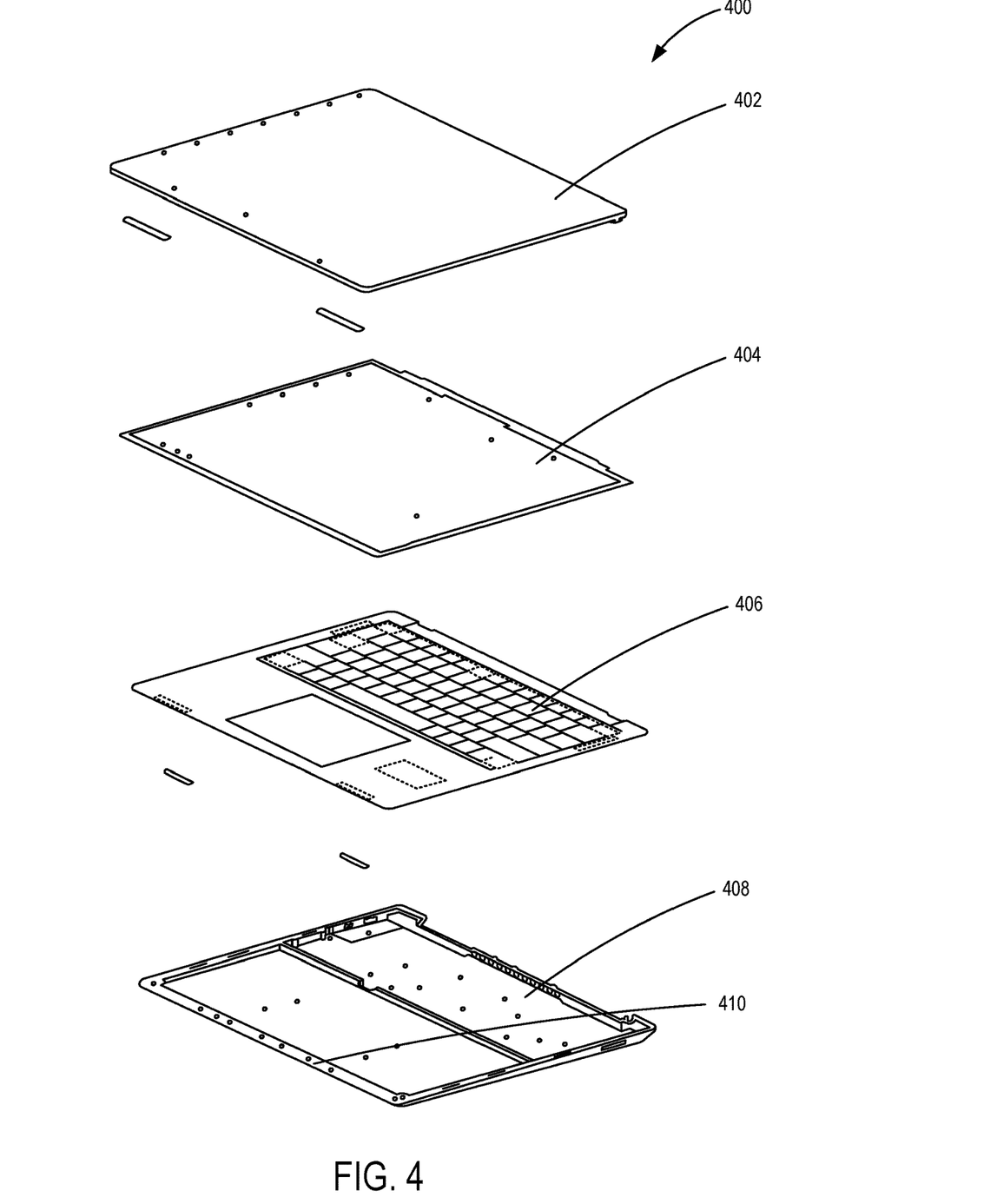
FIG. 4 is an exploded view of components of a foldable electronic device according to an embodiment.

The present disclosure allows for adjustment of the magnetic force of a foldable device in some examples by easily changing metal pieces that are attracted by magnets, to thereby control the opening force of the device. For example, FIG. 4 illustrates the body pieces of a portable computing device 400 that include a top outside cover 402, a top inside cover 404, a bottom inside cover 406, and a bottom outside cover 408. In this example, the top outside cover 402 and bottom outside cover 408 define the case or housing of the portable computing device 400, with the top inside cover 404 and the bottom inside cover 406 defining the inside portions of the portable computing device 400, such as the display screen and keyboard, respectively. It should be noted that none of the internal electronic components, such as the processors, battery, printed circuit boards, etc. are shown for ease in illustration.

With the present disclosure, metal pieces are added or removed from between the bottom inside cover 406 and the bottom outside cover 408 during manufacture and/or assembly to change the magnetic attraction of the bottom inside cover 406 and the bottom outside cover 408 to the top outside cover 402 and the top inside cover 404, which in some examples includes a plurality of magnets therebetween and that magnetically couple with the metal pieces to create a magnetic force (e.g., opening force) for the portable computing device 400. For example, as described herein, metal members 300 and/or 306 (shown in FIG. 3) are selectively added along an inside edge 410 of the bottom outside cover 408. It should be appreciated that the metal members 300 and/or 306 can be added along any portion of the inside edge 410 of the bottom outside cover 408 and can be configured in a symmetric or non-symmetric arrangement. Additionally, the metal members 300 and/or 306 can be provided along only one side of the inside edge 410 of the bottom outside cover 408 (e.g., front side edge) or along multiple sides of the inside edge 410 of the bottom outside cover 408, such as along one or more of the left or right inside edges 410 (as viewed in FIG. 4). In some example, the metal members 300 and/or 306 are positioned along the inside edge 410 of the bottom outside cover 408 based on a location of one or more magnetic elements (e.g., magnets) coupled with the top outside cover 402.

Figure 5:
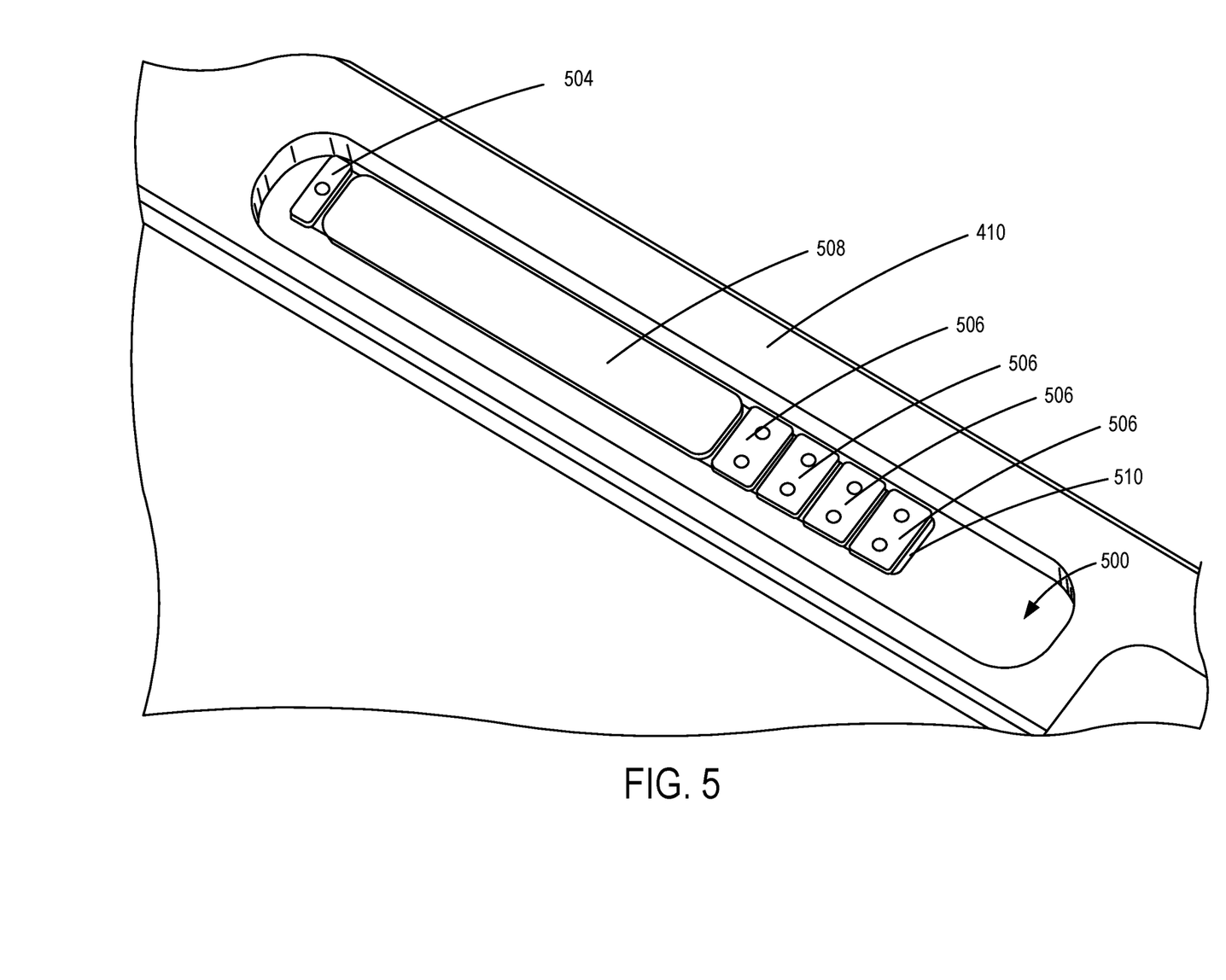
FIG. 5 illustrates a slot having a configuration of metal members according to an embodiment.

FIG. 5 illustrates one adjustable metal configuration that defines an opening force for the portable computing device 400. It should be noted that in some examples, different variations are provided based on the type of device (e.g., manufacturer or model of the device) and/or based on the amount of magnetic force with which the particular device is out of specification. That is, different configurations or variations of the metal pieces, such as having the size and position of the metal pieces varied, are provided and used to tune the opening force of the device by compensating for the out of specification force. For example, a first configuration is provided if the magnetic force is out of specification about 0.1 newtons (N) and a second configuration is provided if the magnetic force is out of specification about 0.3 N. As should be appreciated, many additional configurations can be provided based on different out of specification values and can be customized for the particular device. Additionally, in some examples, the different configurations are designed to accommodate out of specification ranges of magnetic force to allow for easier selective adjustment of the metal pieces, such as removing or adding one or more metal pieces. In this way, magnetic force tuning is provided using different arrangements of the metal pieces that can be easily adjusted to ensure that the device satisfies the spine test 200 and the table test 202.

As shown in FIG. 5, and with continued reference to FIG. 4, positioned with an opening 500 (e.g., a slot or pocket) of the inside edge 410 of the bottom outside cover 408 of the portable computing device 400 are a plurality of metal pieces that define one configuration to adjust the magnetic opening force of the portable computing device 400. In the illustrated embodiments, three different metal members 504, 506, and 508 are coupled within the opening 500, such as using double sided tape 510 (e.g., a strip of pressure sensitive adhesive (PSA)). It should be appreciated that any type of coupling can be used and double sided tape 510 is shown merely for illustration.

As can be seen, the metal members 504, 506, and 508 have different sizes to allows for fine tuning the magnetic force. In one example, the metal members 504, 506, and 508 are preassembled (affixed) to one side of the double sided tape 510 to define a magnetic force compensation configuration. In this way, one or more of the metal members 504, 506, and 508 can be removed before coupling within the opening 500, such as by cutting the double sided tape 510 at one of the ends to remove the metal member 504 or one or more of the metal members 506. In the illustrated configuration, the opening 500 has additional space for adding more metal members 504, 506, and 508, or other sized metal pieces to adjust the magnetic closure force. It should be appreciated that the metal members 504, 506, and 508 can be individually added or removed, as well as added or removed from different portions of the device, such as along different edge portions or non-edge portions of the device. In the illustrated example, the metal member 508 is configured as a base member that results in a base or minimum magnetic force to be applied.

The metal members 504, 506, and 508 can have different sizes and shapes, and the number of each of the metal members 504, 506, and 508, or other metal pieces, can be changed to define different configurations or variations, such as based on an amount of compensation to adjust the magnetic closure force to satisfy both the spine test 200 and the table test 202. Thus, by adjusting applying the different configurations, such as by adding or removing one or more metal members 504, 506, and 508, or other metal pieces, an easy adjustment for controlling the opening force of the device is provided.

Figure 6:
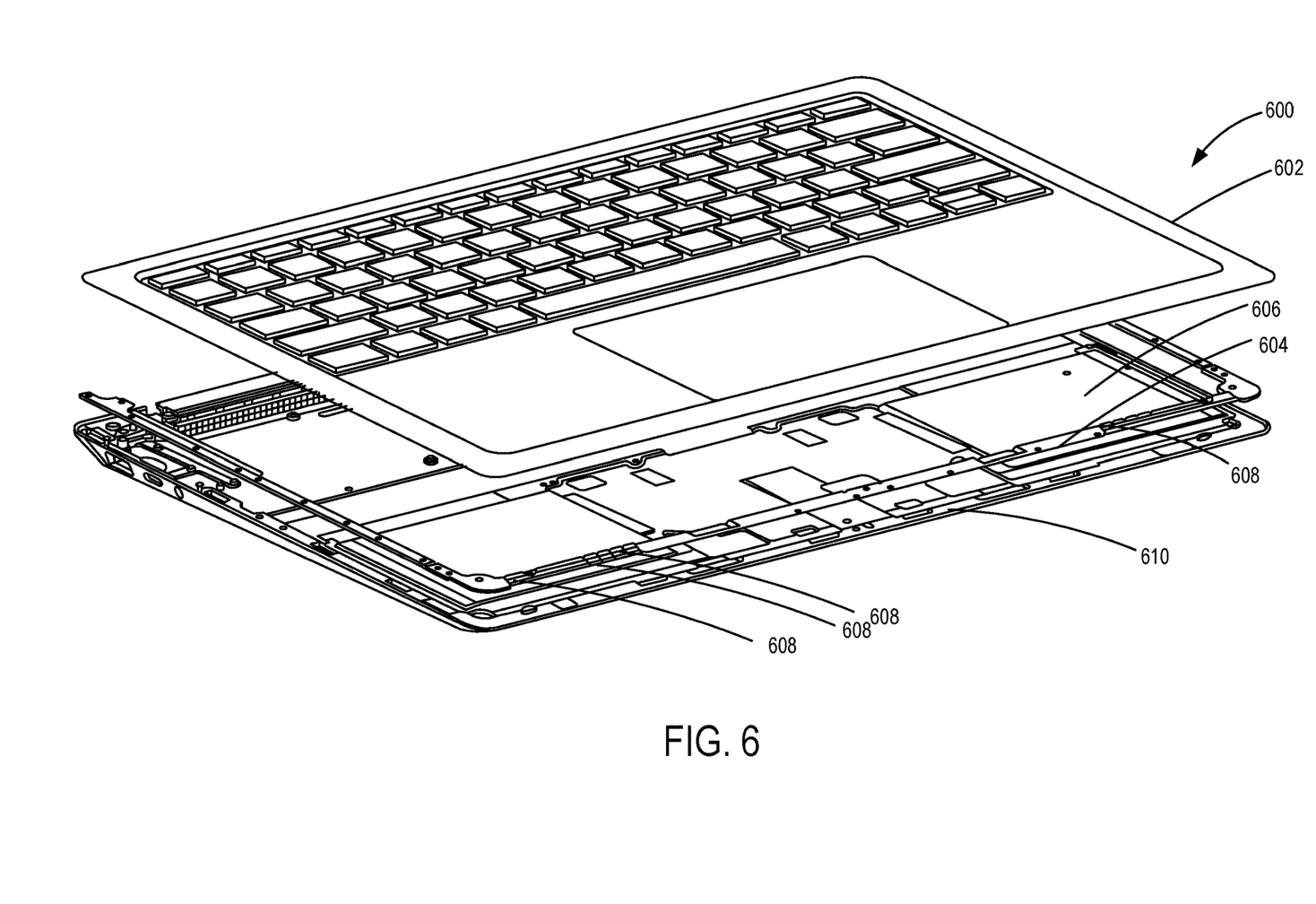
FIG. 6 illustrates metal members arranged within a keyboard of a foldable electronic device according to an embodiment.

As shown in FIG. 6, illustrating a keyboard 600 of a portable electronic device, which in some examples is rotatably coupled to a display screen using a hinge, an edge element 606 is positioned along an edge 610 of a base 604 of the keyboard and is hidden inside the keyboard when a top portion 602 (having the keyboard keys) is coupled to the base 604. As can be seen, the edge element 606 includes a plurality of metal members 608 (having different sizes) that are removable to adjust the magnetic closure force that will be applied between the keyboard 600 and another portion of the portable electronic device, such as the display screen portion. In some examples, different edge elements 606 are provided, each having a different configuration (e.g., pre-configured) of metal members 608 for easy installation along the edge 610 of the base 604. However, in this configuration, one or more metal members 608 are configured to be added or removed as described herein. Moreover, while the edge element 606 is shown as a single pieces extending along the front and side edges 610 of the base 604, multiple edge elements 606 can be provided, such as one having only the metal members 608 to define a particular magnetic attraction area.

Figure 7:
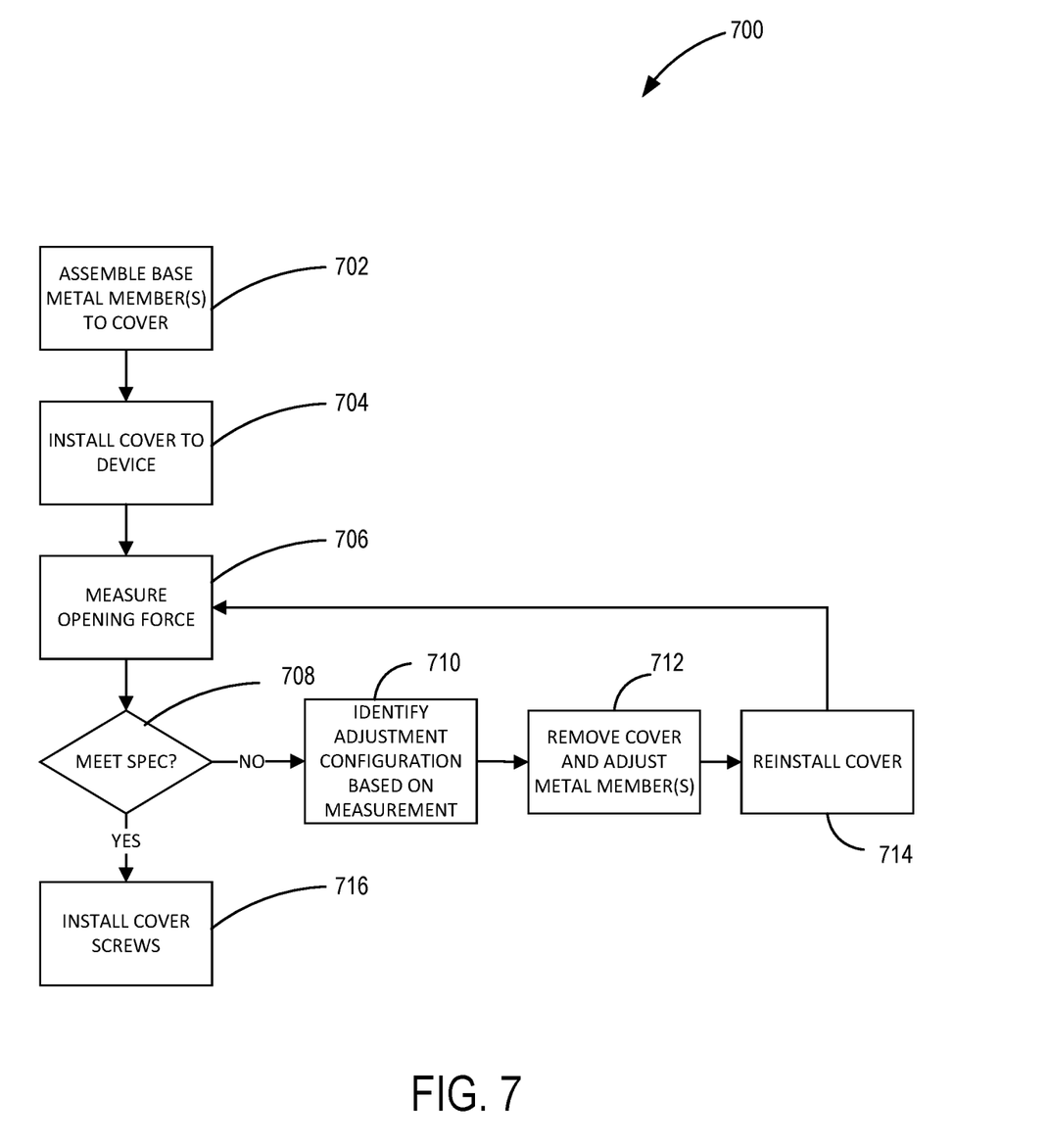
FIG. 7 illustrates a flow chart of a method for adjusting the magnetic opening force of a device according to an embodiment.

FIG. 7 illustrates a flow chart of a method 700 for adjusting the magnetic opening force of a device. For example, by implementing the method 700, one finger open experience results that allows a user to open the device (e.g., portable laptop computer) with a single finger, while also satisfying the spine test 200 and table test 202. The operations illustrated in the flow chart described herein can be performed in a different order than is shown, can include additional or fewer steps and can be modified as desired or needed. Additionally, one or more operations can be performed simultaneously, concurrently or sequentially.

More particularly, and with reference also to FIGS. 1-6, the method 700 includes at 702, assembling one or more base metal members (e.g., a default configuration) to a cover of an electronic device. For example, as described in more detail herein, one or more of metal members 504, 506, and 508 in a defined configuration can be installed within a cover (which in some examples is a bottom cover) of the device, which can be selected based on the type of device. That is, based on the model or other characteristics of the electronic device, a particular configuration of metal members 504, 506, and 508 is selected for initial assembly. In some examples, this includes using one base metal piece, but can also include additional ones of the metal members 504, 506, and 508 depending on the particular electronic device. In one example, at 702, a magnetic attraction area is defined that has a minimum or initial attraction level. However, in other examples, a defined configuration for the metal members 504, 506, and 508 is installed based on similar devices (such as devices of the same model), which may or may not satisfy both the spine test 200 and table test 204, but does not provide an overcompensating magnet force. That is, the assembled default magnets have a magnetic attraction based on the type of electronic device and known mechanical properties of the device, such as the hinge force of the hinge. The metal members are not permanently secured at this point to allow adjustments to be performed, as needed, as described below.

The method 700 includes installing the cover to the device at 704. For example, with one or more of the metal members 504, 506, and 508 installed in the cover, assembly continues with the cover being installed to the device. The installation includes, in some examples, coupling the cover, which defines one pivoting portion of the device, to another picoting portion of the device (e.g., the display screen portion) using a hinge. The assembly of the components to form the laptop computing device with pivoting portions is performed in various examples using portable computing device technology assembly techniques. It should be noted that at this point, the assembly is a preliminary or testing assembly process wherein, for example, not all the fastening members (e.g., screws) are used or fully tightened in order to allow subsequent adjustments, if needed, as described below. In some examples, none of the fastening members are used and the cover is coupled to the device using a temporary securing means, such as straps or other removable members.

The method 700 includes measuring an opening force of the device at 706. That is, an opening force to overcome the magnetic attraction between the installed one or more metal members 504, 506, and 508 and magnets in the device is measured. In one example, a force gauge is fixed to the cover and the cover opened to measure the opening force of the device (e.g., pull the display screen portion away from keyboard portion to overcome the magnetic attraction between the two portions).

A determination is then made at 708 whether the measured force meets a defined specification. For example, a determination is made whether the force allows the device to pass both the spine test 200 and the table test 202 (such as based on known force requirements for the device), which in some examples, includes determining whether the force also meets the one finger open table test, wherein a user is able to open the device while resting on a table with only one finger (without the base lifting). If the specification is not met, then at 710 an adjustment of the opening force is performed, such as to compensate for a difference in the hinge force for this device compared to a typical device of the same device type. For example, a hinge force for a particular device, while within manufacturing tolerances, can still fail the table test 202 with the installed metal members.

In the illustrated example, the adjustment of the opening force includes identifying an adjustment configuration at 710 based on the measurement performed at 706. That is, based on the amount of force (N) that the device is out of specification, an adjustment configuration is identified to change the metal members in the device. This adjustment includes adding or removing one or more metal members 504, 506, and 508 in some examples. In other examples, the adjustment includes removing a set of configured metal members 504, 506, and 508 and replacing the set with a different set of metal members 504, 506, and 508. That is, the adjustment can be performed by changing the configuration of the metal members 504, 506, and 508 by removing or adding one or more metal members 504, 506, and 508 or by replacing an entire set or subset thereof.

With the adjustment configuration determined, the cover of the device is removed and the adjustments performed, such as by changing the configuration of the metal members 504, 506, and 508. This change includes adding or removing one or more of the metal members 504, 506, and 508 in various examples. For example, one or more of the metal members 504, 506, and 508 are removed, and/or removed and replaced with one or more different metal members 504, 506, and 508, or additional metal members 504, 506, and 508 are added.

The cover is then reinstalled on the device 714, which is performed in the same manner as performed at 704. The opening force is then again measured at 706 and a determination made at 708 whether the measured force meets the defined specification. If the defined specification is still not met, further adjustments are performed with the steps 710, 712, and 714 repeated. If the defined specification is met, then the cover is securely installed on the device at 716, such as by using screws or other permanent securing means. At this point, the assembled device has an adjusted magnetic force that is controlled to ensure that the spine test 200 and table test 202 are satisfied, and to allow one finger opening operation in various examples.

Figure 8:
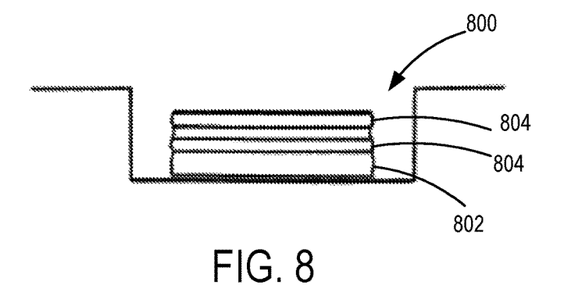
FIG. 8 illustrates an arrangement of metal members according to an embodiment.

Variations and modifications are contemplated by the present disclosure. For example, the various elements, such as magnets or metal member, can be adjusted in different directions. As described above, magnets or metal members can be added or removed, such as in the x-direction or y-direction, thereby providing adjustment in the x-direction and/or y-direction. However, the present disclosure contemplates adjustments in the z-direction such as illustrated in FIGS. 8-11, which can be performed in addition to or alternatively to adjustments in the x-direction and/or y-direction. As illustrated in FIG. 8, a plurality of metal metals are positioned within an opening 800 (e.g., a slot or pocket) in a stacked (z-direction) configuration. In this example, a base metal member 802 (e.g., steel member) is positioned within the opening 800 with one or more additional metal members 804 (three are shown) positioned on the base metal member 802. In one example, the additional metal members 804 are steel foil members coupled to the base metal member with adhesive (or other securing means). It should be noted that additional or fewer metal members 804 can be provided for adjusting the magnetic force (e.g., opening force) of an electronic device. Thus, similar to adding metal members next to other members in a side-by-side configuration, metals members can be stacked to adjust the opening force.

Figure 9:
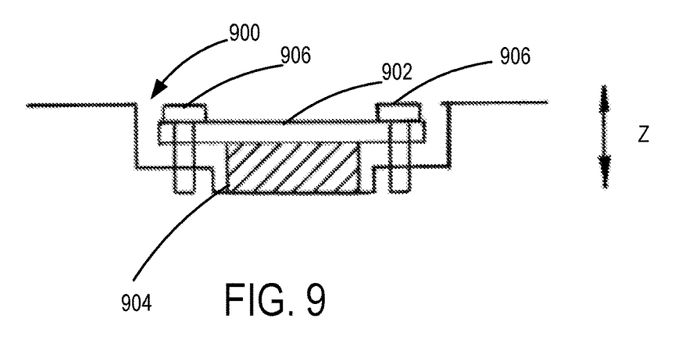
FIG. 9 illustrates an arrangement of metal members according to an embodiment.

As illustrated in FIG. 9, a metal member is adjustably positioned within an opening 900 (e.g., a slot or pocket). In this example, a metal member 902 is positioned on a compressible member 904 (e.g., foam or spring) and secured within the opening 900 with fasteners 906 (e.g., bolts or screws). In operation, by tightening or loosening the fasteners 906, the metal member 902 can be moved up or down in the z-direction. This movement allows for adjustment of the magnetic force. It should be appreciated that any type of fastener 906 or fastening arrangement can be used. In the illustrated example, the fastener 906 secures through an opening (not shown) of the metal member 902 and then into a bottom portion of the opening 900, which can have holes (not shown) for receiving (e.g., screwing in) the end of the fasteners 906 (e.g., adjustable screws). Other fastening arrangements can be used.

Figure 10:
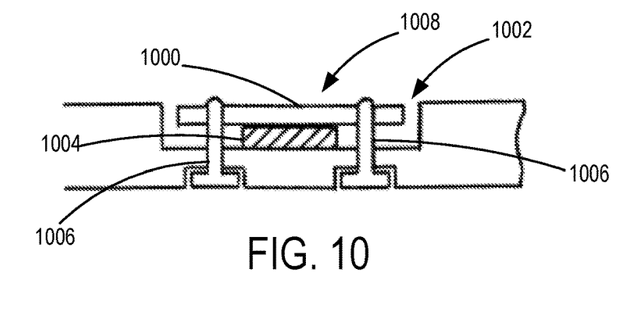
FIG. 10 illustrates an arrangement of metal members according to an embodiment.
Figure 11:
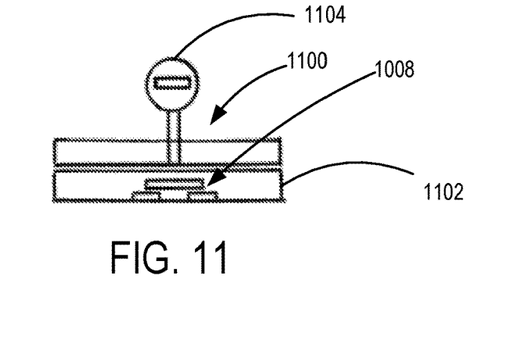
FIG. 11 illustrates an adjustment arrangement for metal members according to an embodiment.

As illustrated in FIGS. 10 and 11, with the adjustable configuration (such as shown in FIG. 9), such as having screws that are accessible when the electronic device is closed, to thereby define an adjustable arrangement 1008, adjustments can be performed using a closed loop measurement plus adjustment process. For example, a metal member 1000 is positioned within an opening 1002 (e.g., a slot or pocket) on top of a compressible member 1004 (e.g., foam or spring) and secured in the opening 1002 by fasteners 1006 (e.g., screws). As shown in FIG. 11, a closed loop measurement plus adjustment configuration 1100 allows for the use of a gauge 1104 (e.g., a force gauge) positioned on an electronic device 1102 having the adjustable arrangement 1008 therein to perform force measurements and adjustments (e.g., tighten or loosen the fasteners 1006). That is, a method of adjustment includes performing force measurements when the electronic device 1102 is closed and adjusting the accessible fasteners 1006. However, as should be appreciated, different measurement and adjustment mechanisms and devices can be used.

Thus, the present disclosure provides individually adjustable metal pieces that allow for controlling the opening force of an electronic device (e.g., laptop computer) to avoid a sub-optimal user experience, such as having the electronic device open in a transport bag (e.g., backpack) or not easily open, such as with one finer, when placed on a table.

Exemplary Operating Environment

Figure 12:
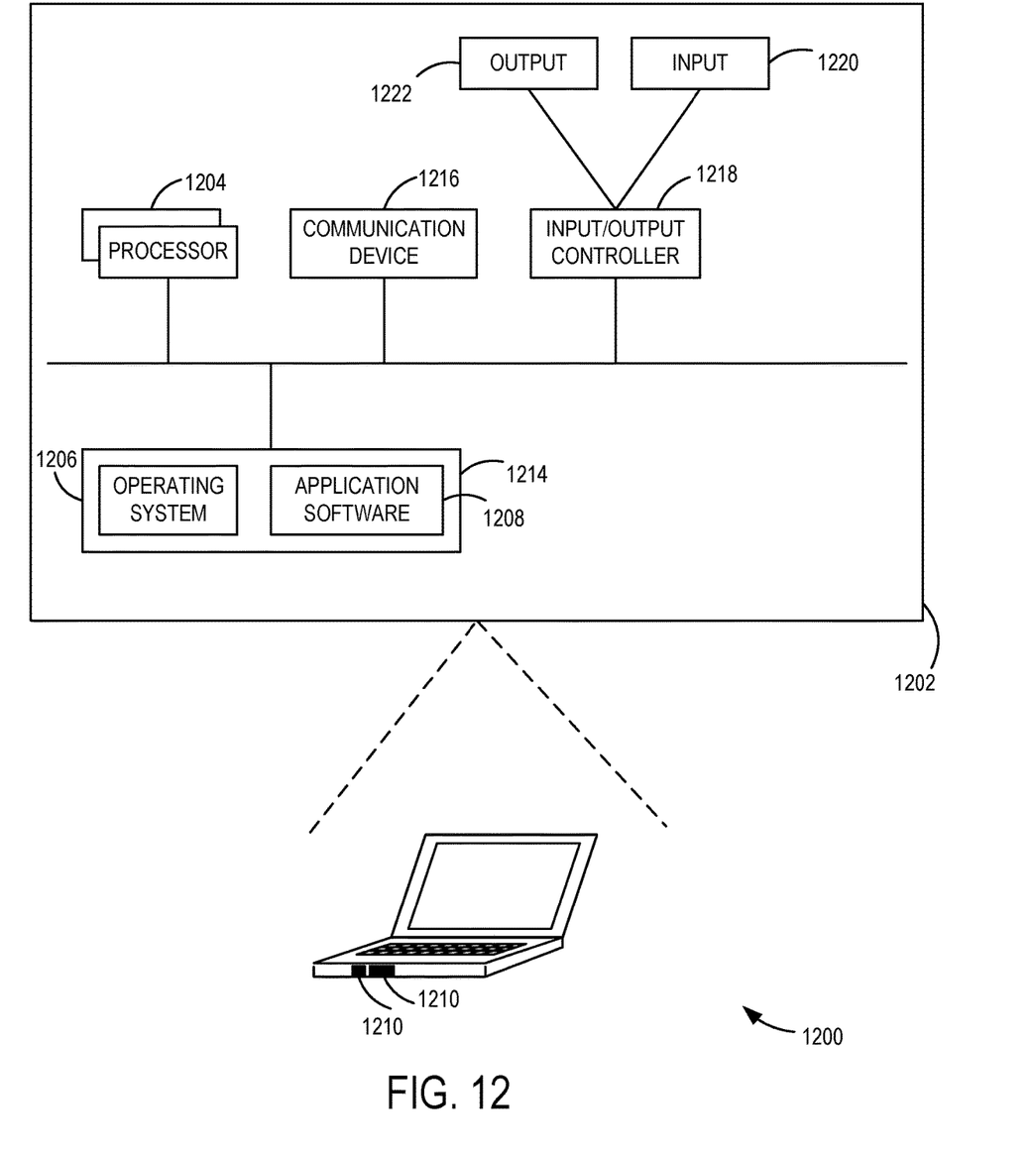
FIG. 12. is a block diagram of an example computing environment suitable for implementing some of the various examples disclosed herein.

The present disclosure is operable with a computing apparatus 1202 (illustrated as a laptop computer) according to an embodiment as a functional block diagram 1200 in FIG. 12. In one example, components of the computing apparatus 1202 can be implemented as a part of an electronic device according to one or more embodiments described in this specification having one or more metal pieces 1210 to control the magnetic opening force. The computing apparatus 1202 comprises one or more processors 1204 which may be microprocessors, controllers or any other suitable type of processors for processing computer executable instructions to control the operation of the electronic device. Platform software comprising an operating system 1206 or any other suitable platform software may be provided on the apparatus 1202 to enable application software 808 to be executed on the device.

Computer executable instructions can be provided using any computer-readable media that are accessible by the computing apparatus 1202. Computer-readable media can include, for example, computer storage media such as a memory 1214 and communications media. Computer storage media, such as the memory 1214, include volatile and non-volatile, removable and non-removable media implemented in any method or technology for storage of information such as computer readable instructions, data structures, program modules or the like. Computer storage media include, but are not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing apparatus. In contrast, communication media may embody computer readable instructions, data structures, program modules, or the like in a modulated data signal, such as a carrier wave, or other transport mechanism. As defined herein, computer storage media do not include communication media. Therefore, a computer storage medium should not be interpreted to be a propagating signal per se. Propagated signals per se are not examples of computer storage media. Although the computer storage medium (the memory 1214) is shown within the computing apparatus 1202, it will be appreciated by a person skilled in the art, that the storage can be distributed or located remotely and accessed via a network or other communication link (e.g. using a communication interface 1216).

The computing apparatus 1202 can comprise an input/output controller 1218 configured to output information to one or more input devices 1220 and output devices 1222, for example a display or a speaker, which can be separate from or integral to the electronic device. The input/output controller 1218 can also be configured to receive and process an input from the one or more input devices 1220, for example, a keyboard, a microphone or a touchpad. In one embodiment, the output device 1222 can also act as the input device 1220. An example of such a device can be a touch sensitive display. The input/output controller 1218 can also output data to devices other than the output device 1222, e.g. a locally connected printing device. In some embodiments, a user can provide input to the input device(s) 1220 and/or receive output from the output device(s) 1222.

In some examples, the computing apparatus 1202 detects voice input, user gestures or other user actions and provides a natural user interface (NUI). This user input can be used to author electronic ink, view content, select ink controls, play videos with electronic ink overlays and for other purposes. The input/output controller 1218 outputs data to devices other than a display device in some examples, e.g. a locally connected printing device.

NUI technology enables a user to interact with the computing apparatus 802 in a natural manner, free from artificial constraints imposed by input devices such as mice, keyboards, remote controls and the like. Examples of NUI technology that are provided in some examples include but are not limited to those relying on voice and/or speech recognition, touch and/or stylus recognition (touch sensitive displays), gesture recognition both on screen and adjacent to the screen, air gestures, head and eye tracking, voice and speech, vision, touch, gestures, and machine intelligence. Other examples of NUI technology that are used in some examples include intention and goal understanding systems, motion gesture detection systems using depth cameras (such as stereoscopic camera systems, infrared camera systems, red green blue (rgb) camera systems and combinations of these), motion gesture detection using accelerometers/gyroscopes, facial recognition, three dimensional (3D) displays, head, eye and gaze tracking, immersive augmented reality and virtual reality systems and technologies for sensing brain activity using electric field sensing electrodes (electro encephalogram (EEG) and related methods).

The functionality described herein can be performed, at least in part, by one or more hardware logic components. According to an example, the computing apparatus 902 is configured by the program code when executed by the processor(s) 804 to execute the embodiments of the operations and functionality described. Alternatively, or in addition, the functionality described herein can be performed, at least in part, by one or more hardware logic components. For example, and without limitation, illustrative types of hardware logic components that can be used include FPGAs, ASICs, ASSPs, SOCs, CPLDs, and GPUs.

At least a portion of the functionality of the various elements in the figures can be performed by other elements in the figures, or an entity (e.g., processor, web service, server, application program, computing device, etc.) not shown in the figures.

Although described in connection with an exemplary computing system environment, examples of the disclosure are capable of implementation with numerous other general purpose or special purpose computing system environments, configurations, or devices.

Examples of well-known computing systems, environments, and/or configurations that may be suitable for use with aspects of the disclosure include, but are not limited to, mobile or portable computing devices (e.g., smartphones), personal computers, server computers, hand-held (e.g., tablet) or laptop devices, multiprocessor systems, gaming consoles or controllers, microprocessor-based systems, set top boxes, programmable consumer electronics, mobile telephones, mobile computing and/or communication devices in wearable or accessory form factors (e.g., watches, glasses, headsets, or earphones), network PCs, minicomputers, mainframe computers, distributed computing environments that include any of the above systems or devices, and the like. In general, the disclosure is operable with any device with processing capability such that it can execute instructions such as those described herein. Such systems or devices can accept input from the user in any way, including from input devices such as a keyboard or pointing device, via gesture input, proximity input (such as by hovering), and/or via voice input.

Examples of the disclosure may be described in the general context of computer-executable instructions, such as program modules, executed by one or more computers or other devices in software, firmware, hardware, or a combination thereof. The computer-executable instructions can be organized into one or more computer-executable components or modules. Generally, program modules include, but are not limited to, routines, programs, objects, components, and data structures that perform particular tasks or implement particular abstract data types. Aspects of the disclosure can be implemented with any number and organization of such components or modules. For example, aspects of the disclosure are not limited to the specific computer-executable instructions or the specific components or modules illustrated in the figures and described herein. Other examples of the disclosure can include different computer-executable instructions or components having more or less functionality than illustrated and described herein.

In examples involving a general-purpose computer, aspects of the disclosure transform the general-purpose computer into a special-purpose computing device when configured to execute the instructions described herein.

Other examples include:

A foldable electronic device comprising:
  a first portion;
  a second portion;
  a hinge connecting the first portion and the second portion, the hinge configured to allow pivoting movement of the first portion relative to the second portion, the hinge having a hinge force;
  one or more magnets coupled to the first portion; and
  a plurality of metal members coupled to the second portion, each metal member of the plurality of metal members configured for individual removal from the second portion to define a magnetic force based on the hinge force.

Other examples include:

A method for adjusting an opening force of a foldable electronic device, the method comprising:
  coupling one or more base metal members to a cover;
  installing the cover to the foldable electronic device with a pivoting connection;
  measuring an opening force of the cover;
  identifying an adjustment configuration to place the opening force within a defined specification;
  removing the cover and applying the adjustment configuration by removing, adding, or moving one or more metal members to the cover; and
  reinstalling the cover to the foldable electronic device.

Other examples include:

A foldable electronic device comprising:
  a keyboard portion;
  a display portion;
  a hinge connecting the keyboard portion and the display portion, the hinge configured to allow folding movement of the keyboard portion relative to the display portion, the hinge having a hinge force;
  one or more magnets coupled within and along an edge of a cover of the display portion; and
  a plurality of metal members coupled within and along an edge of a cover of the keyboard portion, each metal member of the plurality of metal members configured for individual removal from the cover of the keyboard portion to define a magnetic force based on the hinge force, at least one metal member of the plurality of metal members having a different size than at least one other metal member of the plurality of metal members.

Alternatively, or in addition to the other examples described herein, examples include any combination of the following:
  wherein the plurality of metal members comprises one or more metal members having a first size and one or more metal members having a second size, wherein the first size is different than the second size.
  wherein the plurality of metal members are arranged in a first configuration based on a type of the electronic device, and further comprising a second configuration of metal members, wherein the first and second configurations correspond to different magnetic force compensations relative to the hinge force.
  wherein the second configuration comprises a different set of metal members than the first configuration.
  wherein the plurality of metal members comprise individually removable steel pieces coupled within a slot of the second portion.
  wherein the metal members of the plurality of metal members are selected to satisfy a spine test force requirement and a table test force requirement.
  wherein the plurality of metal members comprise only one metal member of a first size, more than one metal member of a second size, and at least one metal member of a third size, wherein the first size has a length longer than a length of the second size, and the second size has a length longer than a length of the third size.
  wherein installing the cover comprises coupling the cover to the foldable electronic device without screws in a temporary connection and reinstalling the cover comprises coupling the cover to the foldable electronic device with screws in a permanent connection.
  wherein identifying an adjustment magnet configuration comprising identifying one of a plurality of defined configuration, each having a different set of metal members, the metal members in each set having metal members of different sizes.
  wherein the defined specification is a force that satisfies both a spine test force requirement and a table test force requirement of the foldable electronic device.
  wherein the measuring, identifying, removing, and reinstalling are performed a plurality of times.
  wherein removing, adding, or moving one or more metal members comprises individually removing, adding, or moving the metal members within a slot of the cover in at least one of an x-direction, a y-direction, and a z-direction, the slot positioned along a edge of the cover
  wherein the plurality of metal members comprise a steel pieces having a same width and thickness, and at least some of the steel pieces having a different length than other steel pieces.
  wherein coupling one or more base metal members to a cover comprises using a set of metal pieces in a configuration selected for a device type of the foldable electronic device based on a typical hinge force of the device type.
  wherein the cover comprises a metal outer top surface.
  wherein the cover comprises a fabric outer top surface.
  wherein the plurality of metal members are selected to satisfy a spine test force requirement and a table test force requirement.
  wherein the plurality of metal members comprise steel pieces, each of the steel pieces having a same width and a same thickness, at least one of the steel pieces having a length different than a length of at least one other of the steel pieces.

Any range or device value given herein can be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above can relate to one embodiment or can relate to several embodiments. The embodiments are not limited to those that solve any or all of the stated problems or those that have any or all of the stated benefits and advantages. It will further be understood that reference to 'an' item refers to one or more of those items.

The embodiments illustrated and described herein as well as embodiments not specifically described herein but within the scope of aspects of the claims constitute exemplary means for training a neural network. The illustrated one or more processors 904 together with the computer program code stored in memory 914 constitute exemplary processing means for allowing switching between multiple keyboard layouts.

The term "comprising" is used in this specification to mean including the feature(s) or act(s) followed thereafter, without excluding the presence of one or more additional features or acts.

In some examples, the operations illustrated in the figures can be implemented as software instructions encoded on a computer readable medium, in hardware programmed or designed to perform the operations, or both. For example, aspects of the disclosure can be implemented as a system on a chip or other circuitry including a plurality of interconnected, electrically conductive elements.

The order of execution or performance of the operations in examples of the disclosure illustrated and described herein is not essential, unless otherwise specified. That is, the operations can be performed in any order, unless otherwise specified, and examples of the disclosure can include additional or fewer operations than those disclosed herein. For example, it is contemplated that executing or performing a particular operation before, contemporaneously with, or after another operation is within the scope of aspects of the disclosure.

When introducing elements of aspects of the disclosure or the examples thereof, the articles "a," "an," "the," and "said" are intended to mean that there are one or more of the elements. The terms "comprising," "including," and "having" are intended to be inclusive and mean that there can be additional elements other than the listed elements. The term "exemplary" is intended to mean "an example of" The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A foldable electronic device comprising:
   a first portion;
   a second portion;
   a spine having a hinge connecting the first portion and the second portion, the hinge configured to allow pivoting movement of the first portion relative to the second portion, the hinge having a hinge force;
   one or more magnets coupled to the first portion; and
   a plurality of metal members coupled to the second portion, each metal member of the plurality of metal members configured for individual removal from the second portion to define a magnetic force corresponding to the hinge force such that the first and second portions remain closed in a spine supported position with the first and second portions supported on the spine, and are separable in a table supported position with the first portion moving and the second portion supported on a surface and remaining stationary and on the surface in response to an opening force applied to the first portion.

2. The foldable electronic device of claim 1, wherein the plurality of metal members comprises one or more metal members having a first size and one or more metal members having a second size, wherein the first size is different than the second size.

3. The foldable electronic device of claim 1, wherein the plurality of metal members are arranged in a first configuration based on a type of the electronic device, and further comprising a second configuration of metal members, wherein the first and second configurations correspond to different magnetic force compensations relative to the hinge force, and wherein a number of the plurality of metal members is selected to compensate for a difference in the hinge force compared to another foldable electronic device, and satisfying manufacturing tolerances.

4. The foldable electronic device of claim 3, wherein the second configuration comprises a different set of metal members than the first configuration.

5. The foldable electronic device of claim 1, wherein the plurality of metal members are configured for individualized magnetic force control to balance the hinge force with the magnetic force, such that in the spine supported position, the first and second portions are supported only on the spine in an upright position and remain closed as a result of the balance of the hinge force with the magnetic force, thereby satisfying a spine test force, and in the table supported position, the second portion is supported on the surface and remains on the surface without additional force applied thereto as the first portion is moved to an open position, thereby satisfying a table test force.

6. The foldable electronic device of claim 1, wherein a number of the plurality of metal members is selected to allow one finger operation to lift the first portion in the table supported position without lifting the second portion, and wherein the second portion remains stationary with the opening force being applied to only the first portion and no force is applied to the second portion while the opening force is applied to the first portion.

7. The foldable electronic device of claim 1, wherein the second portion comprises a slot, and the plurality of metal members comprises individually removable steel pieces coupled within the slot of the second portion, and wherein the individually removable steel pieces comprise only one metal member of a first size, more than one metal member of a second size, and at least one metal member of a third size, wherein the first size has a length longer than a length of the second size, and the second size has a length longer than a length of the third size.

8. A method for adjusting an opening force of a foldable electronic device, the method comprising:
   coupling one or more base metal members to a cover;
   installing the cover to the foldable electronic device with a pivoting connection, the pivoting connection comprising a hinge positioned within a spine of the foldable electronic device;
   measuring an opening force of the cover;
   identifying an adjustment configuration to place the opening force within a defined specification such that the cover remains in a closed position in a spine supported position with the cover supported on the spine, and is separable to an open position in a table supported position with the cover moving and a base of the foldable electronic device remaining stationary on a surface in response to an opening force applied to the cover;
   removing the cover and applying the adjustment configuration by at least one of removing, adding, or moving one or more metal members; and
   reinstalling the cover to the foldable electronic device.

9. The method of claim 8, wherein installing the cover comprises coupling the cover to the foldable electronic device without screws in a temporary connection and reinstalling the cover comprises coupling the cover to the foldable electronic device with screws in a permanent connection.

10. The method of claim 8, wherein identifying an adjustment magnet configuration comprising identifying one of a plurality of defined configurations, each configuration having a different set of metal members, the metal members in each set having metal members of different sizes.

11. The method of claim 8, wherein the defined specification is a force that satisfies both a spine test force requirement and a table test force requirement of the foldable electronic device.

12. The method of claim 8, wherein the measuring, identifying, removing, and reinstalling are performed a plurality of times.

13. The method of claim 8, wherein removing, adding, or moving one or more metal members comprises individually removing, adding, or moving the metal members within a slot of the cover in at least one of an x-direction, a y-direction, and a z-direction, the slot positioned along a edge of the cover.

14. The method of claim 8, wherein the plurality of metal members comprises steel pieces having a same width and thickness, and at least some of the steel pieces having a different length than other steel pieces.

15. The method of claim 8, wherein coupling one or more base metal members to a cover comprises using a set of metal pieces in a configuration selected for a device type of the foldable electronic device based on a typical hinge force of the device type.

16. The method of claim 8, wherein the cover comprises a metal outer top surface.

17. The method of claim 8, wherein the cover comprises a fabric outer top surface.

18. A foldable electronic device comprising:
a keyboard portion;
a display portion;
a spine having a hinge connecting the keyboard portion and the display portion, the hinge configured to allow folding movement of the keyboard portion relative to the display portion, the hinge having a hinge force;
one or more magnets coupled within and along an edge of a cover of the display portion; and
a plurality of metal members coupled within and along an edge of a cover of the keyboard portion, each metal member of the plurality of metal members configured for individual removal from the cover of the keyboard portion to define a magnetic force corresponding to the hinge force such that the keyboard portion and the display portion remain closed in a spine supported position with the keyboard portion and the display portion supported on the spine, and are separable in a table supported position with the display portion moving and the keyboard portion remaining stationary and on a support surface in response to an opening force applied to the display portion, at least one metal member of the plurality of metal members having a different size than at least one other metal member of the plurality of metal members.

19. The foldable electronic device of claim 18, wherein the plurality of metal members are selected to satisfy a spine test force requirement and a table test force requirement.

20. The foldable electronic device of claim 18, wherein the plurality of metal members comprise steel pieces, each of the steel pieces having a same width and a same thickness, at least one of the steel pieces having a length different than a length of at least one other of the steel pieces.

* * * * *